(12) United States Patent
Yin

(10) Patent No.: US 10,345,387 B2
(45) Date of Patent: Jul. 9, 2019

(54) COMPACT APPARATUS AND SYSTEM FOR A BATTERY TESTER

(71) Applicant: Hsueh Cheng Yin, Paramount, CA (US)

(72) Inventor: Hsueh Cheng Yin, Paramount, CA (US)

(*) Notice: Subject to any disclaimer, the term of this patent is extended or adjusted under 35 U.S.C. 154(b) by 9 days.

(21) Appl. No.: 15/899,332

(22) Filed: Feb. 19, 2018

(65) Prior Publication Data

US 2018/0299512 A1 Oct. 18, 2018

Related U.S. Application Data

(60) Provisional application No. 62/485,947, filed on Apr. 16, 2017.

(51) Int. Cl.
| | |
|---|---|
| *H02J 7/00* | (2006.01) |
| *G01R 31/371* | (2019.01) |
| *G01R 31/36* | (2019.01) |
| *G01R 31/389* | (2019.01) |
| *G01R 1/04* | (2006.01) |
| *G01R 31/387* | (2019.01) |

(52) U.S. Cl.
CPC ....... *G01R 31/371* (2019.01); *G01R 31/3646* (2019.01); *G01R 31/3648* (2013.01); *G01R 31/389* (2019.01); *H02J 7/0042* (2013.01); *H02J 7/0047* (2013.01); *G01R 1/0416* (2013.01); *G01R 31/387* (2019.01)

(58) Field of Classification Search
CPC ....... Y02E 60/12; H02J 7/0042; H02J 7/0045; H02J 7/0047; H01M 10/46; H01M 10/44; G01R 31/371; G01R 31/389; G01R 31/3646; G01R 31/3648; G01R 31/387; G01R 1/0416
See application file for complete search history.

(56) References Cited

U.S. PATENT DOCUMENTS

| | | | | |
|---|---|---|---|---|
| 4,577,144 A | * | 3/1986 | Hodgman | H02J 7/027 320/106 |
| 6,369,577 B1 | * | 4/2002 | Cho | G01R 31/386 324/426 |
| 6,570,385 B1 | * | 5/2003 | Roberts | G01R 31/007 324/378 |

(Continued)

*Primary Examiner* — Arun C Williams
(74) *Attorney, Agent, or Firm* — Alexander Chen, Esq.

(57) ABSTRACT

A battery tester housing unit comprising a face plate wherein said face plate faces forwardly and extends in a transverse direction to terminate at a lateral edge, a back plate wherein said back plate faces backwardly and is parallel to said face plate; a surrounding wall which surrounds a peripheral of said base plate and said back plate; a digital display in rectangular shape located on said face plate located on a first end of the face plate; a battery holder apparatus in half cylindrical opening having a positive end and a negative end; said battery holder apparatus is located on a second end of said face plate wherein said second end is located opposite to said first end on said face plate; a first button located in proximity to said digital display; a second button located in proximity to said display and said first button; a third button, a fourth button, a fifth button and a sixth button located in proximity to said battery holder apparatus.

6 Claims, 7 Drawing Sheets

(56) References Cited

U.S. PATENT DOCUMENTS

2005/0253590 A1* 11/2005 Sutherland ......... G01R 31/3646
324/426
2016/0034054 A1* 2/2016 Utykanski ........... G06F 3/03545
235/462.13

* cited by examiner

COMPACT APPARATUS AND SYSTEM FOR A BATTERY TESTER

INCORPORATION BY REFERENCE

This application claims the benefit of priority under 35 USC 119(e) to the filing date of U.S. provisional patent application No. 62/485,947, titled "Method and Apparatus for Multifunctional Battery Tester," which was filed on Apr. 16, 2017, and which is incorporated herein by reference in its entirety.

FIELD OF THE INVENTION

The present invention generally relates to electronic testing devices, and more specifically to a multifunctional lithium-ion battery tester and charger.

BACKGROUND OF THE INVENTION

In recently years, the explosion of mobile device uses has created a high demand for portable batteries. Not only portable, the batteries have to be small and light for users' convenience. Lithium-ion batteries meet all of these requirements. Thus, they are currently the preferred battery type for all mobile devices. Furthermore, since they are small, many cells of battery can be packed together to provide a large capacity battery, and used for all types of vehicles. Electric vehicles have slowly replaced hybrid vehicles, which are half gasoline, half electric, which, in turn, have slowly replaced the traditional gasoline-only vehicles. The battery production industry has now grown to more than $83 billion annually.

As lithium-ion batteries are widely used, some of the uses are for mission critical purposes, in which battery failure has devastating consequences. For examples, an ambulance does not start due to its battery failure, or a pace maker suddenly stops because of its battery failure, or on a freezing day a user cannot restart his car to go home. Thus, people or mechanic shops need a way to check or test batteries for failure or damages, and detect a potential failure to replace dead or decayed batteries before an emergency need arises.

The need for battery tester does not arise only occasionally to check for failure but also every time a user wants to recharge his batteries because batteries, especially lithium-ion, are known to decay over time. The lithium-ion battery works on ion movement between the positive and negative electrodes. In theory such a mechanism should work forever, but cycling, elevated temperature and aging decrease the performance over time. Manufacturers take a conservative approach and specify the life of Li-ion in most consumer products as being between 300 and 500 discharge/charge cycles.

Evaluating battery life on counting cycles is not conclusive because a discharge may vary in depth and there are no clearly defined standards of what constitutes a cycle. In lieu of cycle count, some device manufacturers suggest battery replacement on a date stamp, but this method does not take usage into account. A battery may fail within the allotted time due to heavy use or unfavorable temperature conditions; however, most packs last considerably longer than what the stamp indicates. Thus, it makes common and economic senses to test the batteries' health before one spends energy to recharge them. Furthermore, charging a battery having one or more bad cells may create certain health and safety risks in that the bad cell may emit harmful smoke and/or gases during the charging sequence. A user does not only test to throw out bad batteries and replace them with good and new ones. He also tests so he can confidently use a battery as long as it passes his tests, and save resources.

Battery chargers and testers are a crowded space. There are existing battery chargers and testers on the market. However, none of them provides a battery tester that can perform multiple tests to check the status of a battery, including max capacity, max resistance, and max current. Furthermore, few battery testers are equipped with a charger that can accommodate different battery sizes and capacities.

Most prior arts disclose external probes that are used to link the positive and negative terminals of the battery. Over time, the external probes can be damaged and become difficult for a user to connect and the analyzer to analyze accurately. Furthermore, the external probes provide no structural support for a sturdy and steady contact to the terminals of a battery.

As crowded as the battery tester and charger market, no charger provides a multitude of tests describing the internal health of a battery in one convenient device. Similarly, no tester provides a convenient charger in the same device.

Therefore, it is desirable to have a battery tester that perform multiple tests to check the status of a battery, and is equipped with a charger that can accommodate different battery sizes and capacities, especially when it is all in one compact embodiment.

OBJECT OF THE INVENTION

Accordingly, it is an object of this invention to provide a compact multifunctional battery tester and charger.

It is an object of the invention to provide a compact multifunctional battery tester and charger that provides max capacity, max resistance, and max current tests.

It is an object of the invention to provide a compact multifunctional battery tester and charger that eliminates the unreliable electronic testing probes, and provides a stable and reliable testing dock.

It is an object of the invention to provide a compact multifunctional battery tester and charger that has adjustable testing dock, and accommodates different batteries.

It is an object of the invention to provide a compact multifunctional battery tester and charger that has adjustable testing dock, and accommodates different batteries.

SUMMARY OF INVENTION

In one aspect of invention, a battery utility apparatus comprising a battery tester housing unit comprising a face plate wherein the face plate faces forwardly and extends in a transverse direction to terminate at a lateral edge, a back plate wherein the back plate faces backwardly and is parallel to the face plate; a surrounding wall which surrounds a peripheral of the base plate and the back plate; a digital display in rectangular shape located on the face plate located on a first end of the face plate; a battery holder apparatus in half cylindrical opening having a positive end and a negative end; the battery holder apparatus is located on a second end of the face plate wherein the second end is located opposite to the first end on the face plate; a first button located in proximity to the digital display; a second button located in proximity to the display and the first button; a third button, a fourth button, a fifth button and a sixth button located in proximity to the battery holder apparatus. In one embodiment, the invention includes a host computer located inside the battery utility apparatus; a battery utility platform powered by the host computer comprising a charging platform wherein the charging module is comprised of a charging module wherein the module charges a battery when the battery is located in the battery holding apparatus; and a charging displays module wherein the charging display module comprising a graphic percentage menu wherein the graphic percentage menu displays a percentage of the battery charged in graphical illustration in the digital display, a time duration menu wherein the time duration menu displays the duration of time of the battery charged in the digital display; a numeric percentage menu wherein the a numeric percentage menu displays the percentage of the battery charged in numerical illustration in the digital display; a mode statue menu wherein the mode statue menu displays the battery is being charged; a current testing platform comprised of a current detection module wherein the current testing module detects the maximum current of the battery when the battery is located in the battery holding apparatus; a safety module wherein the safety module provides for adjustment of minimum voltage of the battery so as to not damage the battery; and a current detection displays module wherein the current detection displays module comprising a numeric amp menu wherein the a numeric amp menu displays the maximum current in numeric amp in the digital display; a mode statue menu wherein the mode statue menu displays the battery is tested for maximum current; safety display module wherein the safety display module displays the minimum voltage adjusted for the battery; a resistance testing platform comprised of a resistance detection module wherein the resistance testing module detects the maximum internal resistance of the battery when the battery is located in the battery holding apparatus; and a resistance detection displays module wherein the resistance detection displays module comprising a numeric resistance menu wherein the a numeric resistance menu displays the maximum internal resistance in numeric form in the digital display; a mode statue menu wherein the mode statue menu displays the battery is being tested for maximum internal resistance; a capacity testing platform comprised of a capacity detection module wherein the current capacity detection module detects the maximum capacity of the battery when the battery is located in the battery holding apparatus; a safety module wherein the safety module provides for adjustment of minimum voltage and maximum amp of the battery so as to not damage the battery; and a capacity detection displays module wherein the capacity detection displays module comprising a numeric capacity menu wherein the a numeric capacity menu displays the maximum capacity in numeric mAh value in the digital display; a mode statue menu wherein the mode statue menu displays the battery is tested for maximum current; safety display module wherein the safety display module displays the minimum voltage adjusted for the battery and the maximum mAh adjusted for the batter. In one embodiment, the first button toggles between the capacity testing platform, the resistance testing platform, the current testing platform and the charging platform. In another embodiment, the second button initiates the capacity testing platform or the resistance testing platform or the current testing platform or the charging platform. In another embodiment, the third button increases the value of the minimum voltage or the value of maximum mAh. In another embodiment, fourth button decreases the value of the minimum voltage or the value of maximum mAh.

BRIEF DESCRIPTION OF THE DRAWINGS

These and other features and advantages of the invention will not be described with reference to the drawings of certain preferred embodiments, which are intended to illustrate and not to limit the invention, and in which.

DETAILED DESCRIPTION OF THE INVENTION

Figure 1:
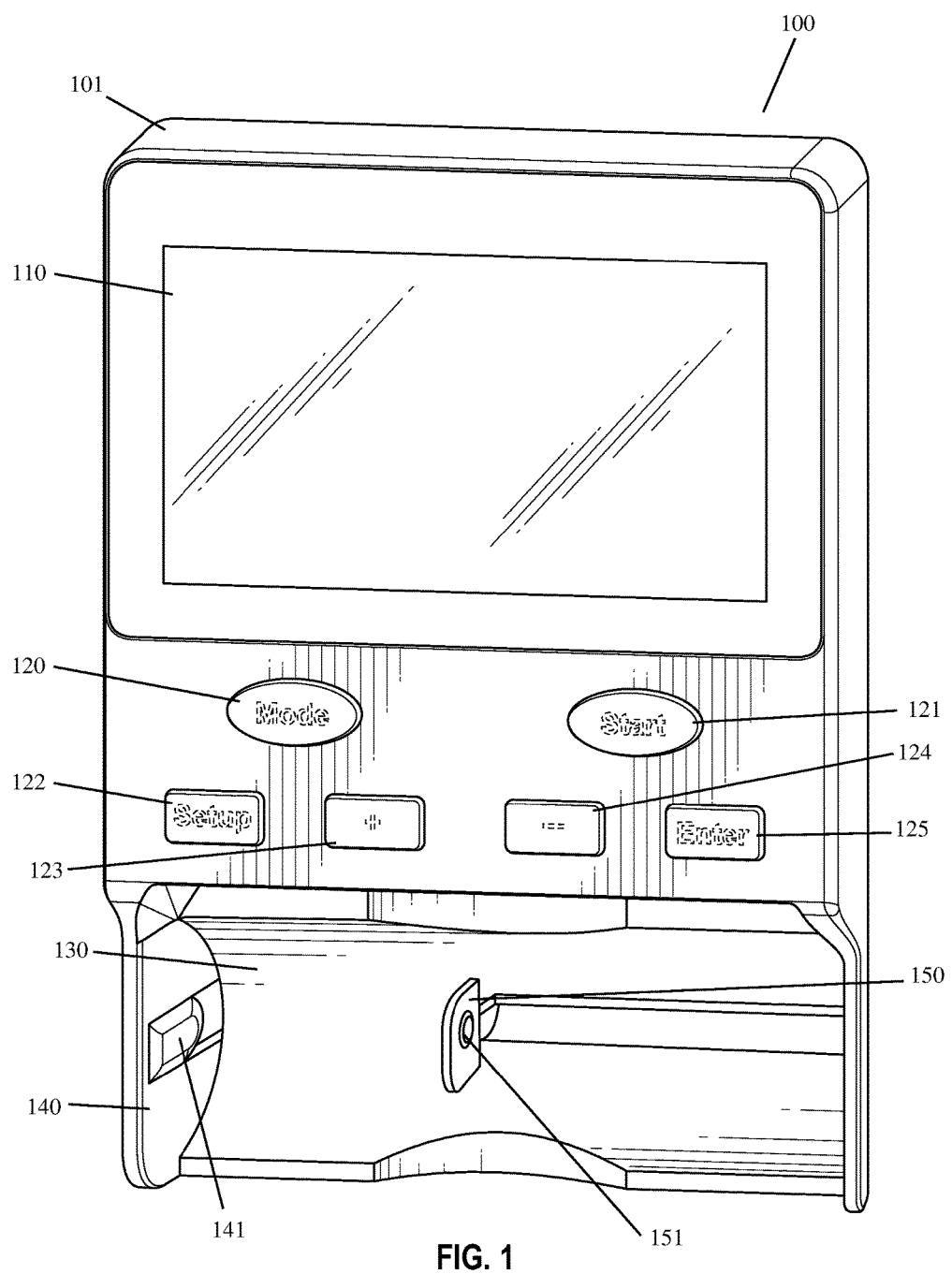
FIG. 1 is a perspective view of an embodiment of a multifunctional battery tester and charger.

Some embodiments are described in detail with reference to the related drawings. Additional embodiments, features, and/or advantages will become apparent from the ensuing description or may be learned by practicing the invention. The following description is not to be taken in a limiting sense, but is made merely for the purpose of describing the general principles of the invention. The steps described herein for performing methods form one embodiment of the invention, and, unless otherwise indicated, not all of the steps must necessarily be performed to practice the invention, nor must the steps necessarily be performed in the order listed. It should be noted that references to "an" or "one" or "some" embodiment(s) in this disclosure are not necessarily to the same embodiment, and such references mean at least one.

The present invention has been conceived with the aim of addressing one or more of the current battery testers' portability and convenience problems. More specifically, the present invention is directed to an apparatus and platform for testing batteries of any sizes, and allowing a convenient recharge of the batteries after the tests are satisfactory. In one embodiment of the current invention, a single resizable chamber is provided for both the tester and charger.

In one aspect of invention, a battery utility apparatus comprising a battery tester housing unit comprising a face plate wherein the face plate faces forwardly and extends in a transverse direction to terminate at a lateral edge, a back plate wherein the back plate faces backwardly and is parallel to the face plate; a surrounding wall which surrounds a peripheral of the base plate and the back plate; a digital display in rectangular shape located on the face plate located on a first end of the face plate; a battery holder apparatus in half cylindrical opening having a positive end and a negative end; the battery holder apparatus is located on a second end of the face plate wherein the second end is located opposite to the first end on the face plate; a first button located in proximity to the digital display; a second button located in proximity to the display and the first button; a third button, a fourth button, a fifth button and a sixth button located in proximity to the battery holder apparatus. In one embodiment, the invention includes a host computer located inside the battery utility apparatus; a battery utility platform powered by the host computer comprising a charging platform wherein the charging module is comprised of a charging module wherein the module charges a battery when the battery is located in the battery holding apparatus; and a charging displays module wherein the charging display module comprising a graphic percentage menu wherein the graphic percentage menu displays a percentage of the battery charged in graphical illustration in the digital display, a time duration menu wherein the time duration menu displays the duration of time of the battery charged in the digital display; a numeric percentage menu wherein the a numeric percentage menu displays the percentage of the battery charged in numerical illustration in the digital display; a mode statue menu wherein the mode statue menu displays the battery is being charged; a current testing platform comprised of a current detection module wherein the current testing module detects the maximum current of the battery when the battery is located in the battery holding apparatus; a safety module wherein the safety module provides for adjustment of minimum voltage of the battery so as to not damage the battery; and a current detection displays module wherein the current detection displays module comprising a numeric amp menu wherein the a numeric amp menu displays the maximum current in numeric amp in the digital display; a mode statue menu wherein the mode statue menu displays the battery is tested for maximum current; safety display module wherein the safety display module displays the minimum voltage adjusted for the battery; a resistance testing platform comprised of a resistance detection module wherein the resistance testing module detects the maximum internal resistance of the battery when the battery is located in the battery holding apparatus; and a resistance detection displays module wherein the resistance detection displays module comprising a numeric resistance menu wherein the a numeric resistance menu displays the maximum internal resistance in numeric form in the digital display; a mode statue menu wherein the mode statue menu displays the battery is being tested for maximum internal resistance; a capacity testing platform comprised of a capacity detection module wherein the current capacity detection module detects the maximum capacity of the battery when the battery is located in the battery holding apparatus; a safety module wherein the safety module provides for adjustment of minimum voltage and maximum amp of the battery so as to not damage the battery; and a capacity detection displays module wherein the capacity detection displays module comprising a numeric capacity menu wherein the a numeric capacity menu displays the maximum capacity in numeric mAh value in the digital display; a mode statue menu wherein the mode statue menu displays the battery is tested for maximum current; safety display module wherein the safety display module displays the minimum voltage adjusted for the battery and the maximum mAh adjusted for the batter. In one embodiment, the first button toggles between the capacity testing platform, the resistance testing platform, the current testing platform and the charging platform. In another embodiment, the second button initiates the capacity testing platform or the resistance testing platform or the current testing platform or the charging platform. In another embodiment, the third button increases the value of the minimum voltage or the value of maximum mAh. In another embodiment, fourth button decreases the value of the minimum voltage or the value of maximum mAh.

Referring to FIG. 1, an exemplary embodiment 100 of the current invention is shown. The compact apparatus comprises a rectangular housing 101 with rounded corners with a dimension of 4 inches in length 3 inches in width and 1 inch in height, a digital display 110, a Mode button 120, a Start button 121, a Setup button 122, a "+" button 123, and a "−" button 124, and a Enter button 125. The Mode button 120 allows a user to press it and cycle through the modes or functions of the apparatus, which consists of Charge, Max Current test, Capacity test, and Internal Resistance (IR) test. When the user presses on the Mode button, the current mode is displayed on the digital display 110. If the user continues to press the Mode button, the next mode of operation is cycled around, and displayed on the digital display 110. Below the digital display and buttons, the apparatus further comprises an adjustable battery dock 130 with one end 140 having a first electrical contact 141 attached, and other end 150 is moveable and adjustable having a second electrical contact 151 attached. The adjustable end 150 allows the battery dock to accommodate many battery sizes.

Figure 2:
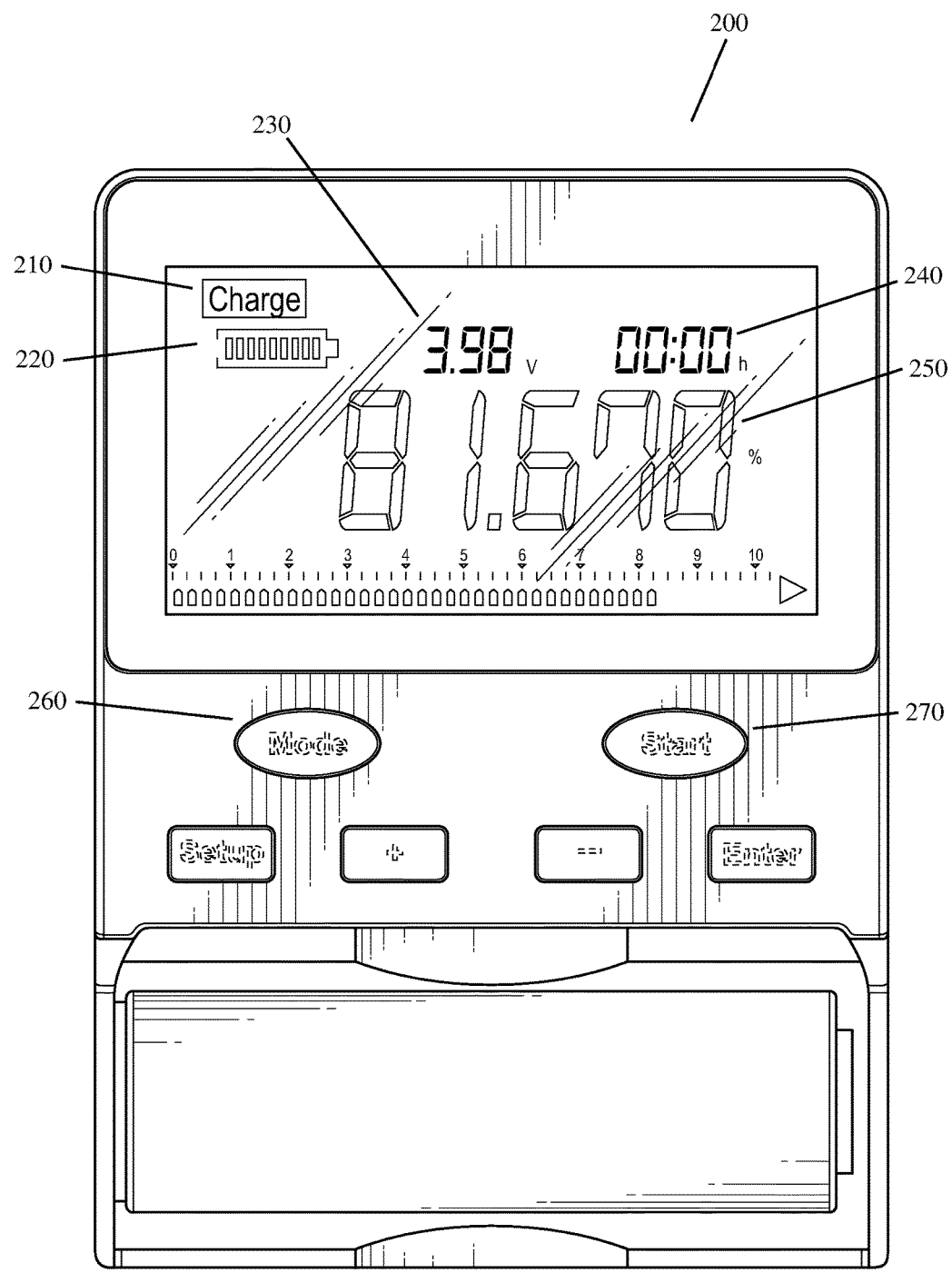
FIG. 2 illustrates an embodiment of a multifunctional battery tester and charger while it is performing a charge function.

Referring to FIG. 2, an exemplary embodiment 200 of the current invention is shown. The currently selected mode is charging. In the upper left corner of the digital display, a "Charge" word is displayed in a rectangular box 210 to inform the user of the current operating mode. Right below box 210, an icon image 220 of the being-charged battery is displayed with the current charge being depicted by the filled up part relative to the length of the icon. To the right of the battery icon on the same row, a 3-digit display 230 shows the current voltage of the battery, and gives the user the first health indicator of the battery. To the most right on the same row, a digital timer 240 is displayed. This timer will alert the user the duration of the selected operation. The digital display further comprises a large digital counter 250 disposed on the next row. In the charging mode, the digital counter shows the percentage of the current charge relative to the full charge the battery can store. It is appreciated that the digital counter counts up the battery's charge as it is being charged. To select the Charge mode, a user presses on the Mode button 260 as many times as necessary to cycle through the modes and until the Charge word is displayed in the box 210. Once the Charge mode is selected, the user then presses on Start button 270 to start the charging.

Figure 3:
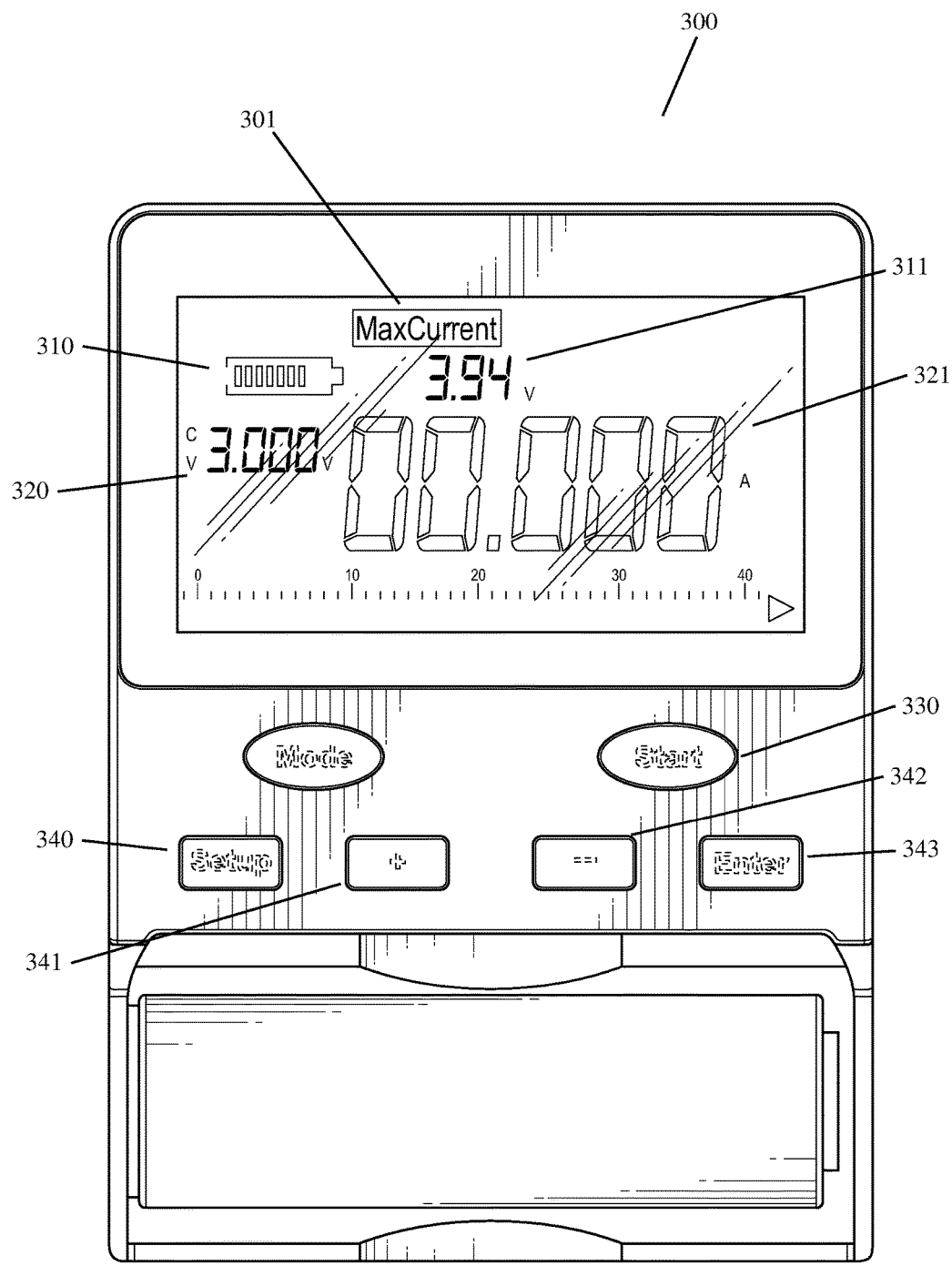
FIG. 3 illustrates an embodiment of a multifunctional battery tester and charger while it is performing the max current test.

FIG. 3 illustrates an exemplary embodiment 300 of the current invention. The currently selected mode of operation is Max Current test and shown on the digital display in a rectangle box 301. The current battery health indicators of charge and voltage are shown with battery icon 310 and digit display 311. On the next row, a digit display 320 shows the set voltage, which is the minimum voltage the apparatus can drain the battery down. To the right of the pre-set voltage display 320 is the digit display 321 of the current amperes which is the measure of how much power per minute the tested battery can provide. FIG. 3 illustrates the device at the beginning of the Max Current test, when the digit display reads 0.000 A. Once the voltage is set by pressing on Setup button 360, the user can use button '+' and '−' to increase or decrease by 0.001 Amps, respectively, the pre-set voltage to the desired value.

Figure 4:
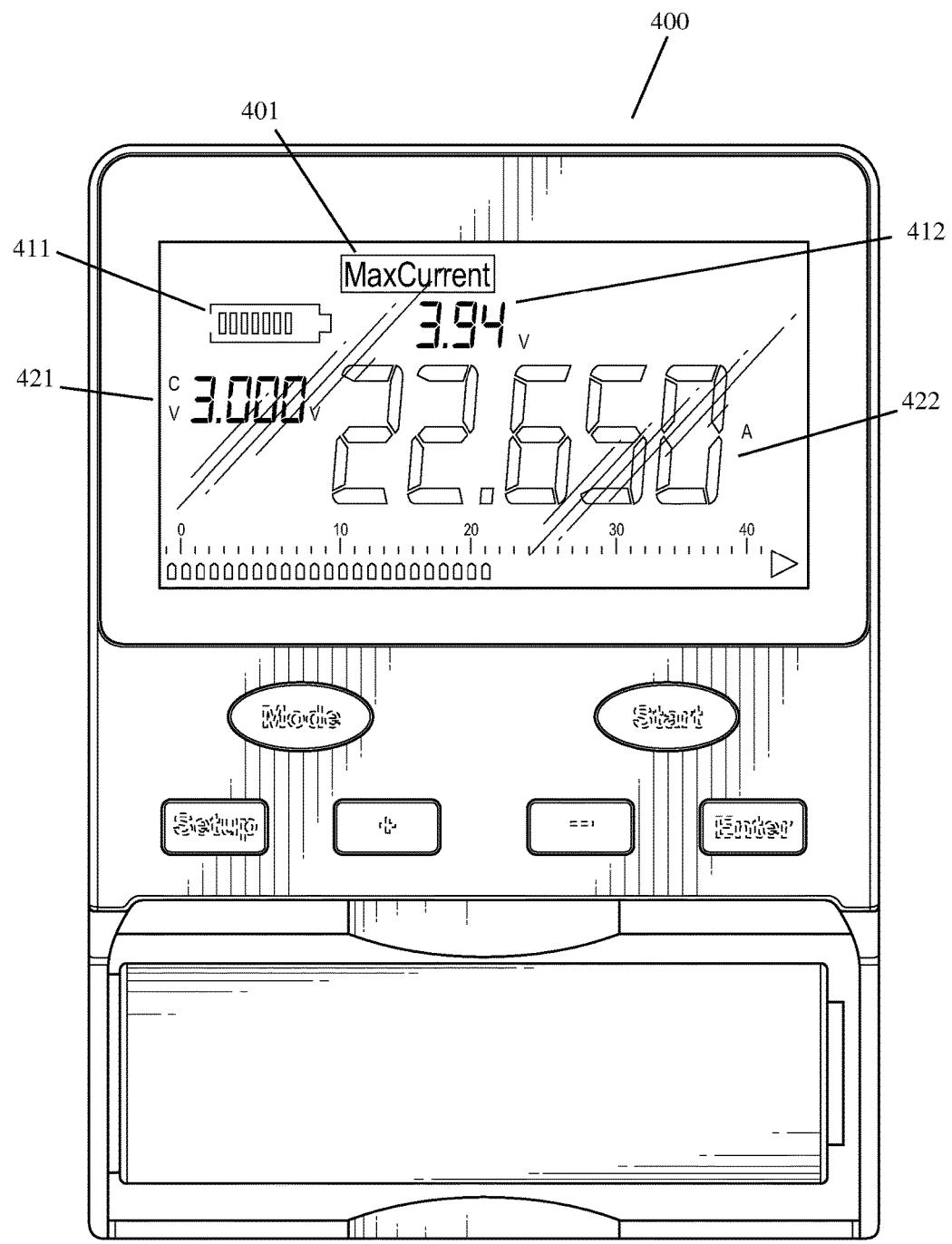
FIG. 4 illustrates an embodiment of a multifunctional battery tester and charger while it is performing the capacity test.

FIG. 4 illustrates another exemplary embodiment 400 of the current invention. The currently selected mode of operation is Max Current test and shown on the digital display in a rectangle box 401. The current battery health indicators of charge and voltage are shown with battery icon 411 and digit display 412. On the next row, a digit display 421 shows the set voltage, which is the minimum voltage the apparatus can drain the battery down. To the right of the pre-set voltage display 421 is the digit display 422 of the current amperes which is the measure of how much power per minute the tested battery can provide. FIG. 4 illustrates the device after the Max Current test is done, and the digit display 422 reads 22.650 AMPS. Max current is another indicator of the battery's health. As a lithium-ion battery decays, it cannot reach its max potential current regardless of how long a user charges it.

Figure 5:
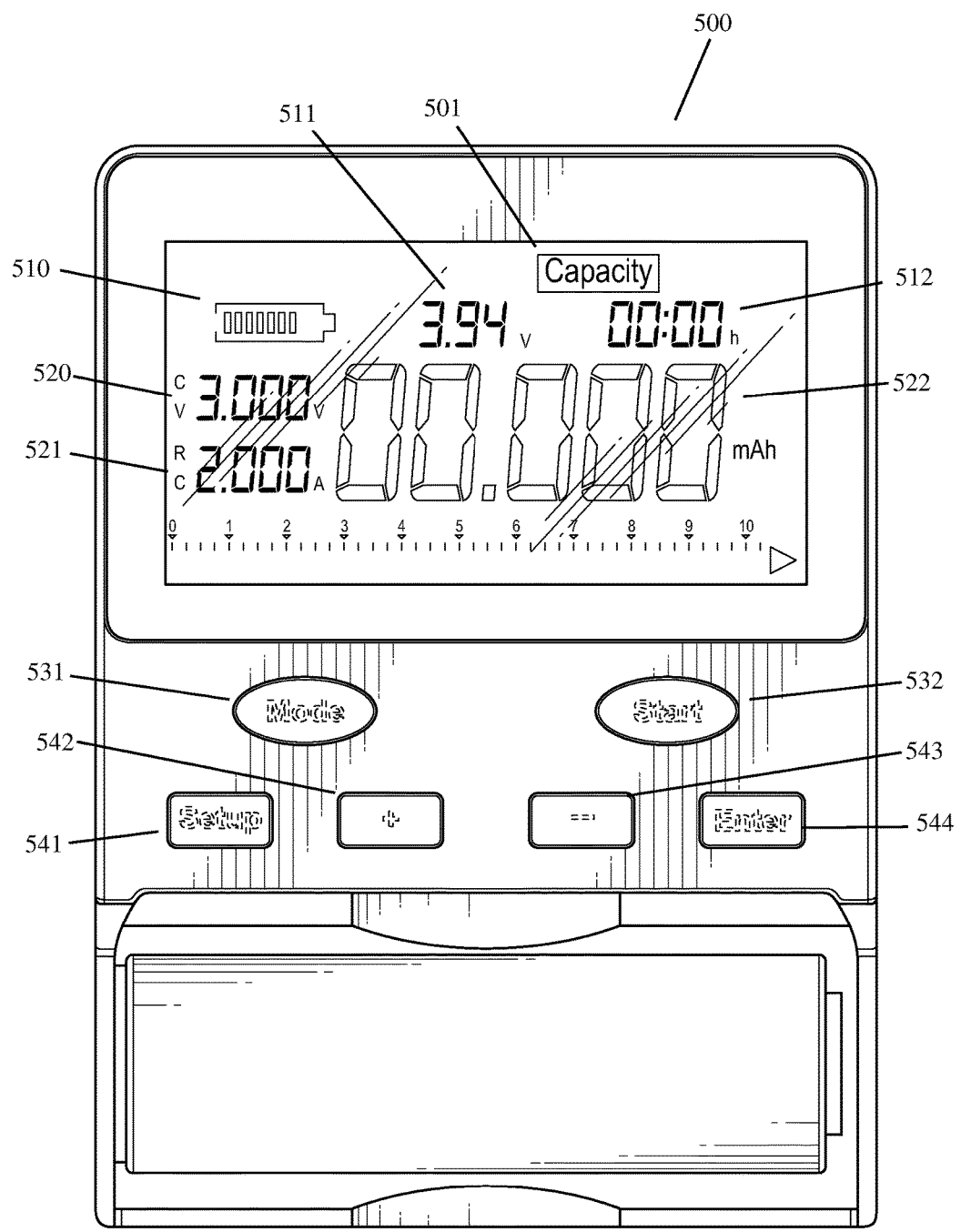
FIG. 5 illustrates an embodiment of a multifunctional battery tester and charger while it is performing the resistance test.

FIG. 5 illustrates an exemplary embodiment 500 of the current invention. The currently selected mode is Capacity test, which is shown in the rectangle box 501 at the top of the digital display. Other health indicators, such as current charge, current voltage, current max current, of the battery are shown with icons 510, 511, and 512, respectively. The pre-set voltage in volts and current in amps for the Capacity test are shown with icons 520 and 521. The capacity of a battery is measured in Amps per hour, which tells a user how much Amps or current he gets in one hour of applying a load to the battery. In this embodiment, the capacity is measured and displayed in milliamperes per hour on the digit display 522. This embodiment 500 applies a small first fixed load and measures the voltage at the end of the first fixed load, and then applies a medium second fixed load and measures the voltage at the end of the second fixed load. The voltage changes are collected and analyzed, and the capacity is computed and displayed to the user on the digit display 522. The digit display 522 shows the capacity test result in milliamperes.

Still referring to FIG. 5, to begin the Capacity test, a user would press the Mode button 531 to cycle through the different operation modes until he sees Capacity shown in the rectangle box 501. To pre-set the drawn-down voltage as shown with icon 520 and the current as shown with icon 521, the user presses on Setup button 541 to cycle to the preset voltage or current. The currently selected setting, voltage or capacitance, is blinking to alert the user the setting he is on. The user then presses on '+' or '−' buttons to increment or decrement by 0.001 unit, and set the desired constant voltage or resistance capacitance. Once getting the desired settings, the user presses Enter button to set the desired settings. Then, the user presses Start button 532 to start the test.

Figure 6:
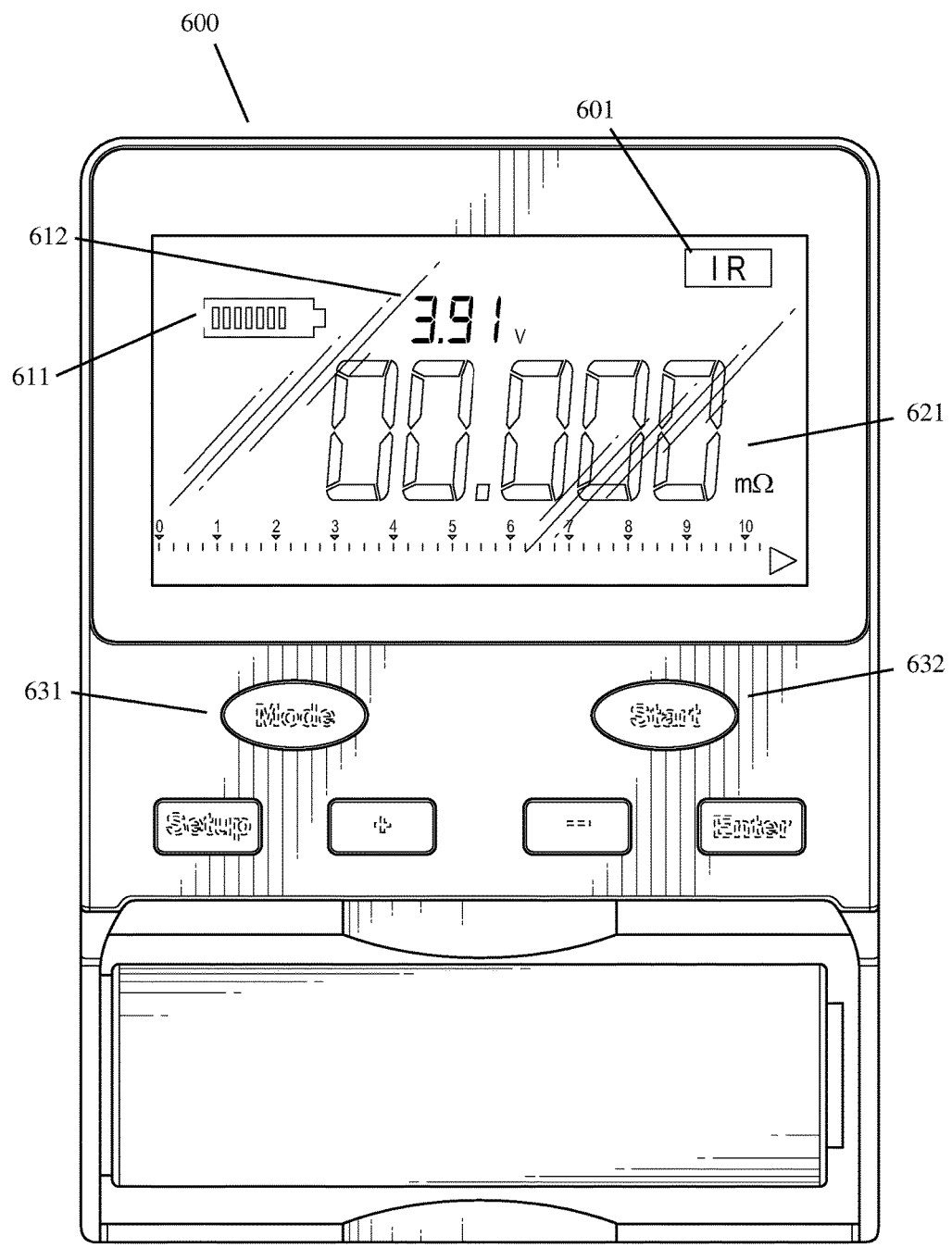
FIG. 6 illustrates an embodiment of a multifunctional battery tester and charger while it is performing the Internal Resistance (IR) test.

FIG. 6 illustrates an exemplary embodiment 600 of the current invention. The currently selected operation mode is Internal Resistance (IR) test, and is shown in rectangle box 601 on the digital display. Internal Resistance (IR) is significant because some of the power output of the battery is immediately lost as heat dissipated by the internal resistance of the battery. The remainder is transmitted to the load. Thus, the higher the IR is, the less efficient the battery. Commonly, toward the end of life of a battery, the IR measurement is high. It is, therefore, one of good indicators of the battery's condition. As consistent throughout the current invention, other battery health indicators are shown on the digital display. Battery current charge is shown with icon 611, and the current voltage with digit display 612. At the start of the IR test, a digit display 621 shows an IR reading of 0.000 milliohms. The user arrives at the IR test mode by pressing Mode button 631 until the IR symbol is displayed in the rectangle box 601 on the digital display. Next, the user presses Start button 632 to run the IR test. The actual IR of the battery is measured and displayed in the digit display 621.

Figure 7:
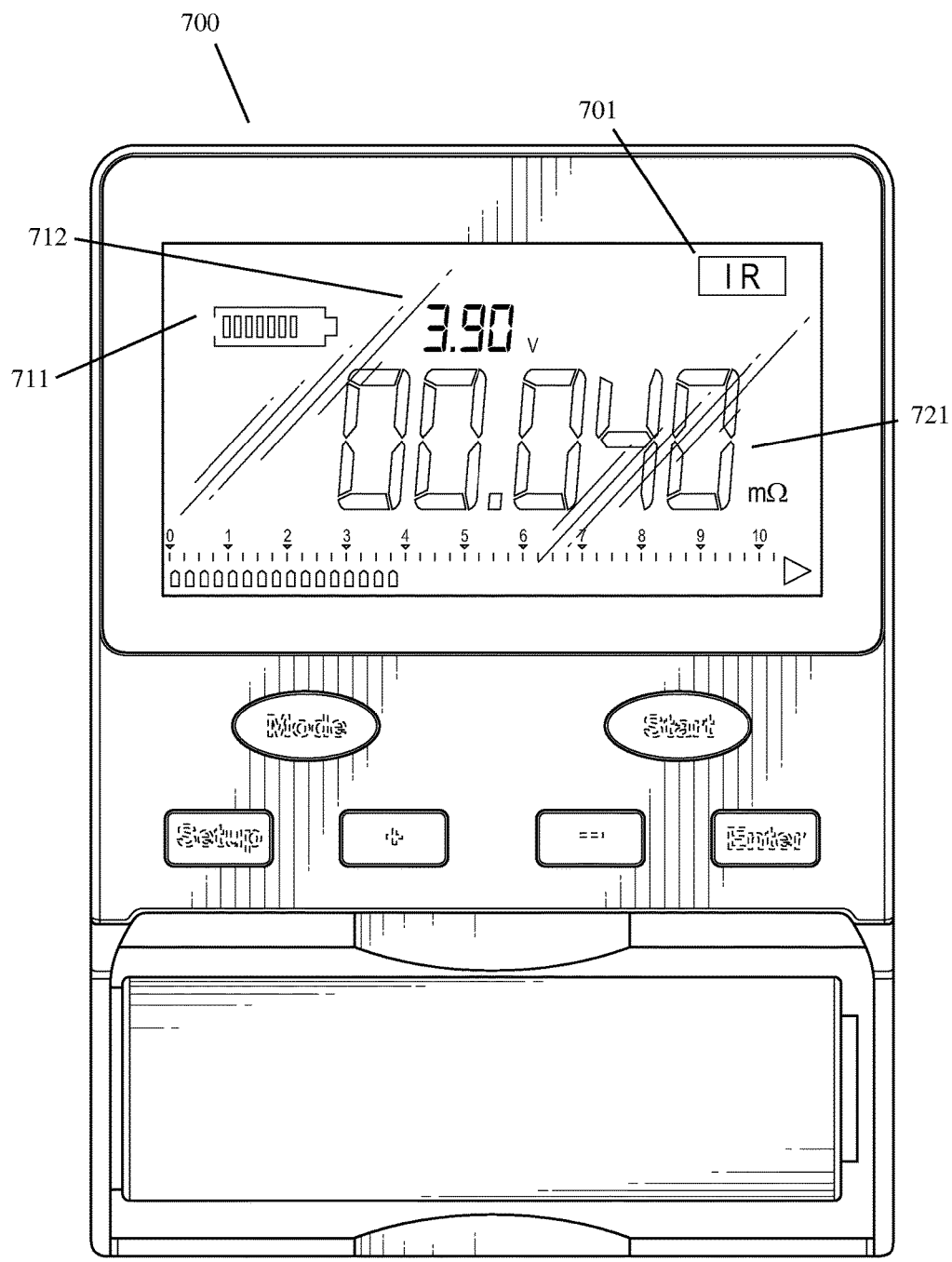
FIG. 7 illustrates an embodiment of a multifunctional battery tester and charger while it is performing the IR test.

Referring to FIG. 7, an embodiment 700 of the current invention is shown where the IR test has finished. The IR mode of operation is shown in the rectangle box 701. The current health indicators of charge and voltage are shown with icons 711 and 712, respectively. The IR test result is shown in the digit display 721. It reads 0.040 milliohms in this instance.

What is claimed is:
1. A battery utility apparatus comprising:
A. a battery tester housing unit comprising a face plate wherein said face plate faces forwardly and extends in a transverse direction to terminate at a lateral edge, a back plate wherein said back plate faces backwardly and is parallel to said face plate;
B. a surrounding wall which surrounds a peripheral of said base plate and said back plate;
C. a digital display in rectangular shape located on said face plate located on a first end of the face plate;
D. a battery holder apparatus in half cylindrical opening having a positive end and a negative end; said battery holder apparatus is located on a second end of said face plate wherein said second end is located opposite to said first end on said face plate;
E. a first button located in proximity to said digital display; a second button located in proximity to said display and said first button; a third button, a fourth button, a fifth button and a sixth button located in proximity to said battery holder apparatus;
F. a host computer located inside said battery utility apparatus; a battery utility platform powered by said host computer comprising
  a. a charging platform wherein said charging module is comprised of a charging module wherein said module charges a battery when said battery is located in said battery holding apparatus; and a charging displays module wherein said charging display module comprising
    i. a graphic percentage menu wherein said graphic percentage menu displays a percentage of said battery charged in graphical illustration in said digital display,
    ii. a time duration menu wherein said time duration menu displays the duration of time of said battery charged in said digital display;
    iii. a numeric percentage menu wherein said a numeric percentage menu displays the percentage of said battery charged in numerical illustration in said digital display;
    iv. a mode statue menu wherein said mode statue menu displays the battery is being charged;
  b. a current testing platform comprised of a current detection module wherein said current testing module detects the maximum current of said battery when said battery is located in said battery holding apparatus; a safety module wherein said safety module provides for adjustment of minimum voltage of said battery so as to not damage said battery;
  c. and a current detection displays module wherein said current detection displays module comprising
    i. a numeric amp menu wherein said a numeric amp menu displays the maximum current in numeric amp in said digital display;
    ii. a mode statue menu wherein said mode statue menu displays the battery is tested for maximum current;
    iii. safety display module wherein said safety display module displays the minimum voltage adjusted for said battery;
  d. a resistance testing platform comprised of a resistance detection module wherein said resistance testing module detects the maximum internal resistance of said battery when said battery is located in said battery holding apparatus;
  e. and a resistance detection displays module wherein said resistance detection displays module comprising i. a numeric resistance menu wherein said a numeric resistance menu displays the maximum internal resistance in numeric form in said digital display;

ii. a mode statue menu wherein said mode statue menu displays the battery is being tested for maximum internal resistance;

f. a capacity testing platform comprised of a capacity detection module wherein said current capacity detection module detects the maximum capacity of said battery when said battery is located in said battery holding apparatus; a safety module wherein said safety module provides for adjustment of minimum voltage and maximum amp of said battery so as to not damage said battery;

g. and a capacity detection displays module wherein said capacity detection displays module comprising i. a numeric capacity menu wherein said a numeric capacity menu displays the maximum capacity in numeric mAh value in said digital display;

ii. a mode statue menu wherein said mode statue menu displays the battery is tested for maximum current;

iii. safety display module wherein said safety display module displays the minimum voltage adjusted for said battery and the maximum mAh adjusted for said batter.

2. The apparatus of claim 1 wherein said first button toggles between said capacity testing platform, said resistance testing platform, said current testing platform and said charging platform.

3. The apparatus of claim 1 wherein said second button initiates said capacity testing platform or said resistance testing platform or said current testing platform or said charging platform.

4. The apparatus of claim 1 wherein said third button increases the value of said minimum voltage or the value of maximum mAh.

5. The apparatus of claim 1 wherein said fourth button decreases the value of said minimum voltage or the value of maximum mAh.

6. The apparatus of claim 1 wherein said face plate is smaller than 12 square inches.

* * * * *